(12) United States Patent
Chuang et al.

(10) Patent No.: US 10,049,956 B2
(45) Date of Patent: Aug. 14, 2018

(54) PASSIVATION STRUCTURE AND METHOD OF MAKING THE SAME

(71) Applicant: Taiwan Semiconductor Manufacturing Company, Ltd., Hsinchu (TW)

(72) Inventors: Cheng-Chi Chuang, New Taipei (TW); Hsuan-Hui Hung, Changhua County (TW); Kun-Ming Huang, Taipei (TW); Ming-Yi Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/700,476

(22) Filed: Sep. 11, 2017

(65) Prior Publication Data

US 2018/0012817 A1    Jan. 11, 2018

Related U.S. Application Data

(60) Division of application No. 14/960,974, filed on Dec. 7, 2015, now Pat. No. 9,761,504, which is a continuation of application No. 14/518,600, filed on Oct. 20, 2014, now Pat. No. 9,209,102, which is a
(Continued)

(51) Int. Cl.
*H01L 31/18* (2006.01)
*H01L 23/31* (2006.01)
*H01L 21/02* (2006.01)
*H01L 51/52* (2006.01)
(Continued)

(52) U.S. Cl.
CPC ...... *H01L 23/3171* (2013.01); *H01L 21/0217* (2013.01); *H01L 21/02118* (2013.01); *H01L 21/02164* (2013.01); *H01L 21/02271* (2013.01); *H01L 21/31* (2013.01); *H01L 23/3192* (2013.01); *H01L 23/53295* (2013.01); *H01L 31/1868* (2013.01); *H01L 51/5253* (2013.01); *H01L 51/5256* (2013.01); *H01L 51/5259* (2013.01); *H01L 2924/0002* (2013.01)

(58) Field of Classification Search
None
See application file for complete search history.

(56) References Cited

U.S. PATENT DOCUMENTS

| 5,459,107 A | * | 10/1995 | Palmour | ............... H01L 21/045 257/E21.055 |
| 7,221,039 B2 | | 5/2007 | Huang et al. | |
| 8,008,208 B2 | | 8/2011 | Stewart et al. | |

(Continued)

FOREIGN PATENT DOCUMENTS

| TW | 429598 | 4/2001 |
| TW | 2000705528 | 2/2007 |
| TW | 201238005 | 9/2012 |

OTHER PUBLICATIONS

Notice of Allowance dated Feb. 11, 2015 from corresponding No. TW 102120255.

*Primary Examiner* — Minh-Loan Tran
(74) *Attorney, Agent, or Firm* — Haynes and Boone, LLP

(57) ABSTRACT

A passivation structure includes a bottom dielectric layer. The passivation structure further includes a doped dielectric layer over the bottom dielectric layer. The doped dielectric layer includes a first doped layer and a second doped layer. The passivation structure further includes a top dielectric layer over the doped dielectric layer.

20 Claims, 3 Drawing Sheets

Related U.S. Application Data continuation-in-part of application No. 13/539,160, filed on Jun. 29, 2012, now Pat. No. 8,884,405.

(51) Int. Cl.
*H01L 23/532* (2006.01)
*H01L 21/31* (2006.01)

(56) References Cited

U.S. PATENT DOCUMENTS

| | | |
|---|---|---|
| 8,564,104 B2 | 10/2013 | Sun et al. |
| 8,809,097 B1 * | 8/2014 | Ravi ............ H01L 31/02167 257/E21.001 |
| 8,884,405 B2 | 11/2014 | Chuang et al. |
| 8,900,891 B2 | 12/2014 | Pawlak et al. |
| 9,209,102 B2 | 12/2015 | Chuang et al. |
| 2002/0163062 A1 | 11/2002 | Wang et al. |
| 2005/0242444 A1 | 11/2005 | Huang et al. |

* cited by examiner

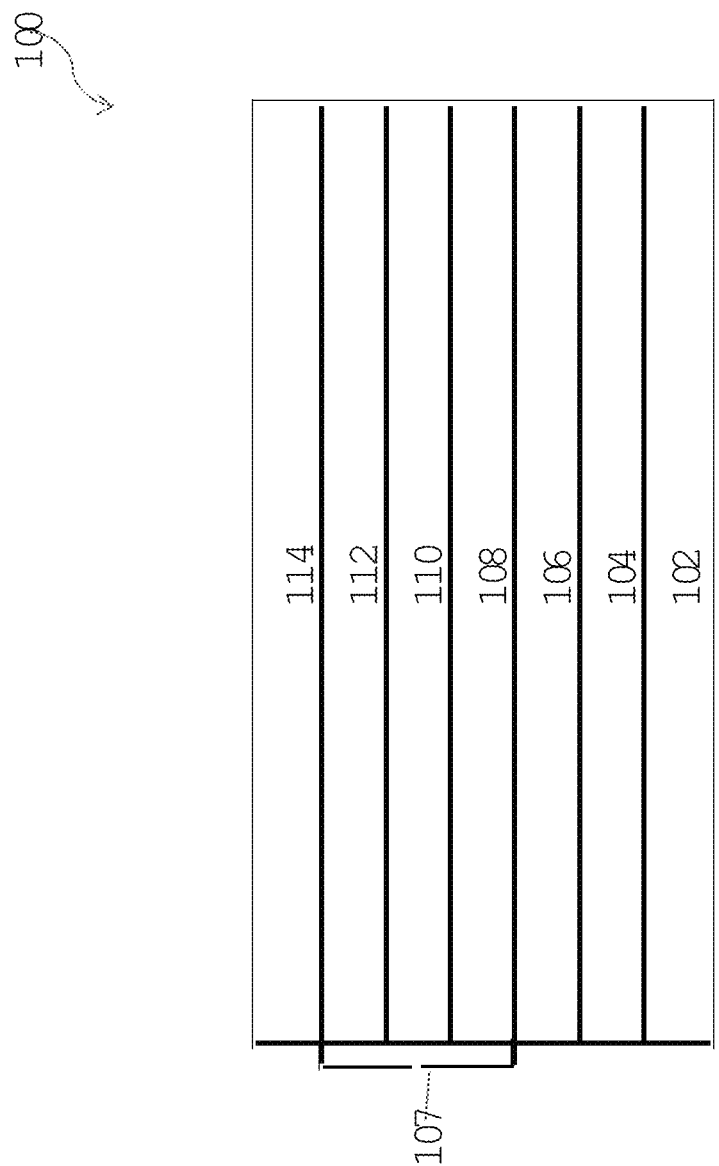

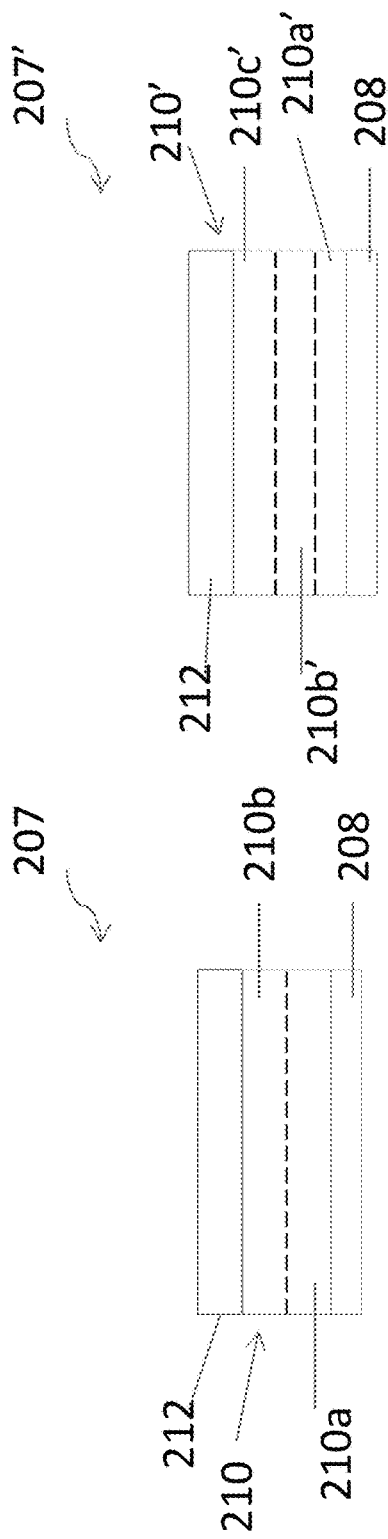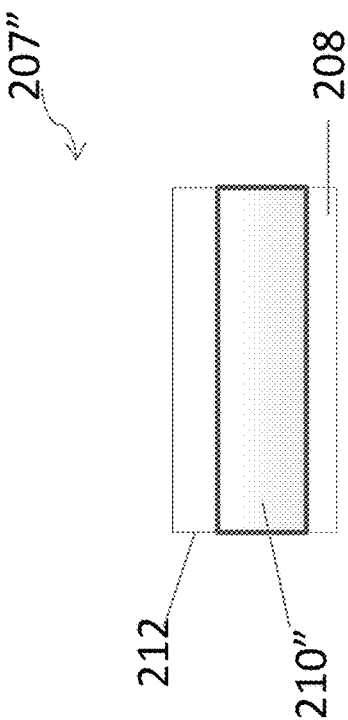

PASSIVATION STRUCTURE AND METHOD OF MAKING THE SAME

PRIORITY CLAIM

The present application is a Divisional of U.S. application Ser. No. 14/960,974 filed Dec. 7, 2015, issuing as U.S. Pat. No. 9,761,504, which is a Continuation of U.S. application Ser. No. 14/518,600 filed Oct. 20, 2014, now U.S. Pat. No. 9,209,102, which is a continuation-in-part of U.S. application Ser. No. 13/539,160, filed Jun. 29, 2012, now U.S. Pat. No. 8,884,405, the disclosures of each of which are incorporated herein by reference in its entirety.

TECHNICAL FIELD

The present disclosure relates generally to an integrated circuit and more particularly a passivation structure and a method of making the same.

BACKGROUND

A passivation film (or layer) deactivates chemically and electrically active broken bonds at a semiconductor surface by reacting with selected elements; e.g. hydrogen or oxide grown on Si surface. Some integrated circuit devices have a passivation film over metal layers.

Integrated circuits including the passivation film are put under product qualification tests such as High Temperature Reverse Bias (HTRB) and/or Pressure Cooker Test (PCT). HTRB testing is an accelerated life-test for integrated circuit devices that is often used to verify the robustness of the devices themselves and the reliability of assembly and packaging of the integrated circuit devices. PCT tests water/moisture resistance at test conditions of high temperature and high pressure.

With some passivation films, mobile ions from molding compound are driven into the passivation films, and moisture can be ionized between the molding compound and the passivation film under HTRB test. These ions cannot be easily neutralized if the passivation film is a good insulator. These mobile ions can degrade the breakdown voltage (BV) of the devices.

BRIEF DESCRIPTION OF THE DRAWINGS

Reference is now made to the following descriptions taken in conjunction with the accompanying drawings, in which:

FIG. 1 is a cross-sectional view of an integrated circuit with a passivation structure according to some embodiments.

FIGS. 2A-2C are cross-sectional views of a passivation structure according to some embodiments.

DETAILED DESCRIPTION

Figure 3:
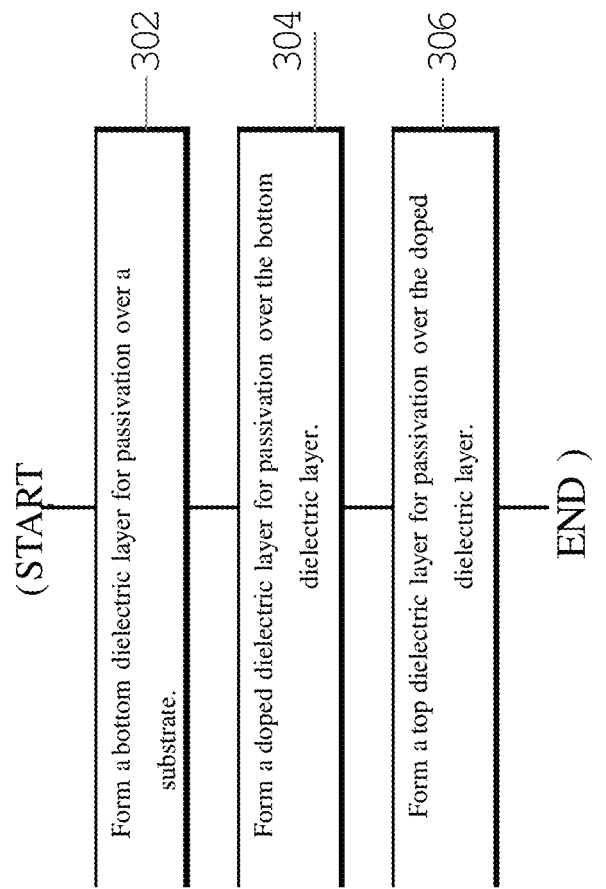
FIG. 3 is a flowchart of a method for forming a passivation structure according to some embodiments.

The making and using of various embodiments are discussed in detail below. It should be appreciated, however, that the present disclosure provides many applicable inventive concepts that can be embodied in a wide variety of specific contexts. The specific embodiments discussed are illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a cross-sectional view of a portion of an integrated circuit 100 with a passivation structure according to some embodiments. The integrated circuit 100 includes a substrate 102, a dielectric layer 104, a metal layer 106, passivation structure 107, and a molding compound layer 114. The substrate 102 comprises silicon, germanium, gallium arsenide, indium phosphide, silicon carbide, Silicon-On-Insulator (SOI), or any other suitable material. Electrical components such as transistors, resistors, any other devices can be formed on the substrate 102 by any suitable methods known in the art in some embodiments.

The dielectric layer 104 comprises silicon dioxide ($SiO_2$), silicon nitride (e.g., $Si_3N_4$), high-k dielectric (e.g., $HfO_2$), low-k dielectric, or any other suitable material. The dielectric layer 104 can be inter metal dielectric (IMD) or inter layer dielectric (ILD) in some embodiments. The metal layer 106 comprises Al, Cu, Sn, Ni, Au, Ag, or other suitable material, and can be deposited using electroplating, physical vapor deposition (PVD), or any other suitable process. The metal layer 106 is used for electrical interconnects or contacts, for example.

The passivation structure 107 includes a bottom dielectric layer 108, a doped-dielectric layer 110, and a top dielectric layer 112. The bottom dielectric layer 108 comprises oxide ($SiO_2$), for example. The bottom dielectric layer 108 is undoped or unintentionally doped, in some embodiments. The bottom dielectric layer 108 has a thickness ranging from 2000 Å to 3000 Å in some embodiments. If a thickness of bottom dielectric layer 108 is too small, bottom dielectric layer does not provide sufficient protection for metal layer 106 in some instances. If a thickness of bottom dielectric layer 108 is too great, additional material is consumed and production costs increase without a substantial increase in performance of the bottom dielectric layer. In some embodiments, bottom dielectric layer 108 is formed using chemical vapor deposition (CVD), physical vapor deposition (PVD), an epitaxial process or another suitable formation process.

The doped dielectric layer 110 includes a dielectric material and a dopant. The dopant includes at least one of a p-type dopant or an n-type dopant. In some embodiments, the dielectric material includes silicon oxide ($SiO_2$) or another suitable dielectric material. In some embodiments, the p-type dopant includes boron, boron di-fluoride, or another suitable p-type dopant. In some embodiments, the n-type dopant includes phosphorous, arsenic, or another suitable n-type dopant. In some embodiments, a concentration of the dopant ranges from about 1% by weight to about 10% by weight. If the concentration of the dopant is too high, doped dielectric layer 110 becomes conductive and does not provide sufficient electrical insulation properties which negatively impacts HTRB stress test results, in some instances. If the concentration of the dopant is too low, doped dielectric layer 110 has a reduced ability to distribute mobile ions, in some instances. A thickness of doped dielectric layer 110 ranges from about 3000 angstroms to about 10,000 angstroms, in some embodiments. If the thickness of doped dielectric layer 110 is too large, additional material is used which increases production cost without a significant increase in performance of the doped dielectric layer, in some instances. If the thickness of doped dielectric layer 110 is too small, an ability of the doped dielectric layer to distribute mobile ions is reduced, in some instances.

In some embodiments, doped dielectric layer 110 is formed using TEOS (Tetraethyl Orthosilicate) using sub-atmospheric pressure chemical vapor deposition (SACVD) or another suitable formation process. In some embodiments, the dopant is introduced into doped dielectric layer 110 during a formation process. In some embodiments, the dopant is introduced after the formation process is completed. In some embodiments, the dopant is introduced after the formation process by ion implantation, annealing or another suitable dopant introduction process.

In some embodiments, doped dielectric layer 110 is a multilayer structure. FIG. 2A is a cross-sectional view of a passivation structure 207 according to some embodiments. Passivation structure 207 is similar to passivation structure 107 and same elements have a same reference number increased by 100. In comparison with passivation structure 107, passivation structure 207 includes a multilayer doped dielectric layer including a first doped layer 210a and a second doped layer 210b. Each of first doped layer 210a and second doped layer 210b includes a dielectric material including a dopant. In some embodiments, a dopant type in first dopant layer 210a is the same as a dopant type in second dopant layer 210b. In some embodiments, the dopant type in first dopant layer 210a is different from the dopant type in second dopant layer 210b. In some embodiments, a dopant species in first dopant layer 210a is the same as a dopant species in second dopant layer 210b. In some embodiments, the dopant species in first dopant layer 210a is different from the dopant species in second dopant layer 210b. A dopant concentration in first doped layer 210a and a dopant concentration in second doped layer 210b independently range from about 1% by weight to about 10% by weight. In some embodiments, the dopant concentration in first dopant layer 210a is the same as the dopant concentration in second dopant layer 210b. In some embodiments, the dopant concentration in first dopant layer 210a is different from the dopant concentration in second dopant layer 210b. In some embodiments, a thickness of first doped layer 210a is equal to a thickness of second doped layer 210b. In some embodiments, the thickness of first doped layer 210a is different from a thickness of second doped layer 210b.

In some embodiments, first doped layer 210a and second doped layer 210b are formed within a same tool by changing flow rates of dopants during formation of the first doped layer or the second doped layer. In some embodiments, first doped layer 210a is formed and is subsequently doped; the second doped layer 210b is formed and is subsequently doped. In some embodiments, a dielectric material in first doped layer 210a is different from a dielectric material in second doped layer 210b. For example, first doped layer 210a is silicon oxide doped with phosphorous and second doped layer 210b is silicon nitride doped with phosphorous, in some embodiments.

FIG. 2B is a cross-sectional view of a passivation structure 207' according to some embodiments. Passivation structure 207' is similar to passivation structure 207. In comparison with passivation structure 207, passivation structure 207' includes a first doped layer 210a', a second doped layer 210b' and a third doped layer 210c'. Similar to first doped layer 210a and second doped layer 210b, first doped layer 210a', second doped layer 210b' and third doped layer 210c' independently include various dopant types, dopant species and dopant concentrations. Varying a dopant concentration between first doped layer 210a'; second doped layer 210b' and third doped layer 210c' helps to control a distribution location for mobile ions. For example, when a dopant concentration of first doped layer 210a' is higher than a dopant concentration of second doped layer 210b' and a dopant concentration of third doped layer 210c', more mobile ions are distributed within the first doped layer instead of the second doped layer or the third doped layer. Similarly, when the dopant concentration of third doped layer 210c' is higher than the dopant concentration of second doped layer 210b' and the dopant concentration of first doped layer 210a', more mobile ions are distributed within the third doped layer instead of the second doped layer or the first doped layer. In some embodiments, second doped layer 210b' has a dopant concentration greater than at least one of first doped layer 210a' or third doped layer 210c'. Controlling the location of mobile ions within doped dielectric layer 110 helps to regulate performance, such as BV, of an integrated circuit, e.g., integrated circuit 100 (FIG. 1). FIGS. 2A and 2B include a multilayer structure having two layers and three layers, respectively. In some embodiments, the multilayer structure of doped dielectric layer includes more than three layers.

In some embodiments, the dopant concentration in doped dielectric layer 110 is variable. FIG. 2C is a cross-sectional view of a passivation structure 207" according to some embodiments. Passivation structure 207" is similar to passivation structure 207. In comparison with passivation structure 207, passivation structure 207" includes at least one doped layer having a gradient dopant concentration. In some embodiments, passivation structure 207" includes at least one doped layer having a substantially constant dopant concentration. In some embodiments, the at least one gradient doped layer has a dopant concentration which increases as a distance from bottom dielectric layer 108 (FIG. 1) increases. In some embodiments, the at least one gradient doped layer has a dopant concentration which increases as the distance from bottom dielectric layer 108 decreases. In some embodiments, the at least one doped layer has a dopant concentration which increases to a maximum as the distance from bottom dielectric layer 108 increases and decreases from the maximum as the distance form the bottom dielectric layer continues to increase. A distribution of mobile ions with doped dielectric layer 210" increases as the dopant concentration increases.

Returning to FIG. 1, top dielectric layer 112 is undoped or unintentionally doped, in some embodiments. In some embodiments, top dielectric layer 112 comprises silicon nitride (e.g., $Si_3N_4$), silicon oxynitride, or polyimide. The top dielectric layer 112 is selected for good performance of water resistance under PCT in some embodiments. The top dielectric layer 112 has a thickness ranging from 2000 Å to 3000 Å in some embodiments. In some embodiments, top dielectric layer 112 is formed with silane using CVD, PVD, an epitaxial process or another suitable formation process. The thicknesses of the bottom dielectric layer 108, the doped dielectric layer 110, and the top dielectric layer 112 can be modified for different devices and applications.

Even though the bottom dielectric layer 108, the doped dielectric layer 110, and the top dielectric layer 112 are formed directly adjacent to the next layer as shown in FIG. 1, there are one or more intervening layers in between the three dielectric layers, in some embodiments.

The molding compound layer 114 comprises polymer such as epoxy or any other suitable molding compound material. The molding compound layer 114 can be formed, e.g., by an injection molding process or hot embossing process.

The passivation structure 107 improves device electric field distribution and performances under HTRB and PCT tests. The top dielectric layer 112, e.g., $Si_3N_4$, protects integrated circuits formed on the substrate 102 from water. The doped dielectric layer 110, e.g., oxide ($SiO_2$) doped with phosphorus and/or boron (e.g., deposited with PTEOS or BPTEOS), provides a path for mobile ions moving from the molding compound layer 114. The mobile ions are distributed relatively uniformly along the doped dielectric layer 110, which prevents local concentration of mobile ions. This prevents mobile ions gathering at device locations such as a drain site and a source site which may build local electric field and deteriorate the integrated circuit functions.

For some exemplary integrated circuits using the passivation structure 107 in FIG. 1, the BV under HTRB test was increased about 50 V from about 850 V to about 900 V after 168 hours under stress. In comparison, conventional integrated circuits without using the passivation structure 107 in FIG. 1 showed reduced BV from about 850 V to about 700 V under the same test. The integrated circuits using the passivation structure 107 also showed good performance after 96 hours under PCT.

FIG. 3 is a flowchart of a method for forming a passivation structure according to some embodiments. At step 302, a bottom dielectric layer, e.g., bottom dielectric layer 108, is formed over a substrate for passivation. The bottom dielectric layer is undoped or unintentionally doped, in some embodiments. The bottom dielectric layer has a thickness ranging from about 2000 Å to about 3000 Å in some embodiments. In some embodiments, the bottom dielectric layer is formed using CVD, PVD, an epitaxial process or another suitable formation process.

At step 304, a doped dielectric layer, e.g., doped dielectric layer 110, is formed over the bottom dielectric layer. The doped dielectric layer includes a dielectric material and at least one n-type dopant or p-type dopant. The doped dielectric layer has a thickness ranging from about 3000 Å to about 10,000 Å in some embodiments. In some embodiments, the doped dielectric layer 110 is formed with TEOS using sub-atmospheric pressure chemical vapor deposition (SACVD) or another suitable formation process.

At step 306, a top dielectric layer, e.g., top dielectric layer 112, is formed over the doped dielectric layer. The top dielectric layer is undoped or unintentionally doped. The top dielectric layer is selected for better performance of water resistance under PCT in some embodiments. The top dielectric layer has a thickness ranging from about 2000 Å to about 3000 Å in some embodiments. The top dielectric layer is formed with silane using CVD, PVD, an epitaxial process or another suitable formation process. The thicknesses of the bottom dielectric layer, the doped dielectric layer, and the top dielectric layer are able to be modified for different devices and applications.

One aspect of this description relates to a passivation structure. The passivation structure includes a bottom dielectric layer. The passivation structure further includes a doped dielectric layer over the bottom dielectric layer. The doped dielectric layer includes a first doped layer and a second doped layer. The passivation structure further includes a top dielectric layer over the doped dielectric layer.

Another aspect of this description relates to a passivation structure. The passivation structure includes a bottom dielectric layer. The passivation structure further includes a doped dielectric layer over the bottom dielectric layer. A dopant concentration of the doped dielectric layer varies as a distance from the bottom dielectric layer increases. The passivation structure further includes a top dielectric layer over the doped dielectric layer. Still another aspect of this description relates to a method of making a passivation structure. The method includes forming a doped dielectric layer over a bottom dielectric layer. Forming the doped dielectric layer includes forming a first doped layer over the bottom dielectric layer, and forming a second doped layer over the first doped layer. The method further includes forming a top dielectric layer over the doped dielectric layer.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method of making a passivation structure, the method comprising:
    forming a doped dielectric layer over a bottom dielectric layer, wherein forming the doped dielectric layer includes varying a dopant concentration of the doped dielectric layer as a distance from the bottom dielectric layer increases; and
    forming a top dielectric layer over the doped dielectric layer.

2. The method of claim 1, wherein the forming the doped dielectric layer includes sub-atmospheric pressure chemical vapor deposition (SACVD).

3. The method of claim 2, wherein the forming the doped dielectric layer includes using tetraethyl orthosilicate (TEOS).

4. The method of claim 1, wherein the forming the doped dielectric layer includes introducing the dopant concentration after formation of a dielectric layer.

5. The method of claim 1, wherein the forming the doped dielectric includes varying the dopant concentration in a single tool by changing a flow rate of dopant material.

6. The method of claim 1, wherein the forming the doped dielectric layer includes varying the dopant concentration of phosphorus.

7. The method of claim 1, further comprising:
forming a molding compound layer over the top dielectric layer.

8. A method of fabricating a semiconductor device, the semiconductor device comprising:
forming a passivation structure, the forming the passivation structure including:
  forming a doped dielectric layer over a bottom dielectric layer, wherein the forming the doped dielectric layer comprises:
    depositing a first doped layer having a first dopant concentration;
    depositing a second doped layer having a second dopant concentration over the first doped layer; and
    depositing a third doped layer having a third dopant concentration over the second doped layer, wherein the third dopant concentration is different from at least one of the first dopant concentration and the second dopant concentration; and
  forming a top dielectric layer over the doped dielectric layer.

9. The method of claim 8, further comprising:
forming the bottom dielectric layer, wherein during the forming the bottom dielectric layer a dopant is not intentionally introduced.

10. The method of claim 8, wherein the first dopant concentration and the second dopant concentration are of a p-type dopant.

11. The method of claim 8, wherein the first dopant concentration and the second dopant concentration are of an n-type dopant.

12. The method of claim 8, wherein the first dopant concentration and the second dopant concentration are between about 1% and about 10% by weight.

13. The method of claim 8, wherein the depositing the first doped layer and the depositing the second doped layer are performed in a same tool.

14. The method of claim 13, wherein the same tool varies a flow rate of dopant between depositing of the first doped layer and the depositing of the second doped layer.

15. The method of claim 8, wherein the first dopant concentration is higher than the second dopant concentration.

16. A method of fabricating a semiconductor device, the semiconductor device comprising:
disposing an inter layer dielectric (ILD) layer and a metal layer over a substrate; and
forming a passivation structure over the ILD layer and the metal layer, wherein the forming the passivation structure includes:
  depositing a bottom dielectric layer;
  forming a doped dielectric layer over the bottom dielectric layer, wherein the forming the doped dielectric layer includes varying one of an n-type dopant concentration or a p-type dopant concentration during the forming the doped dielectric layer; and
  forming a top dielectric layer over the doped dielectric layer.

17. The method of claim 16, wherein the forming the doped dielectric layer includes increasing the one of the n-type dopant concentration or the p-type dopant concentration as a distance from the bottom dielectric layer increases.

18. The method of claim 16, wherein the depositing the bottom dielectric layer includes depositing an undoped or unintentionally doped dielectric material and wherein the forming the top dielectric layer includes depositing another undoped or unintentionally doped dielectric material.

19. The method of claim 16, further comprising:
depositing a molding compound layer over the top dielectric layer.

20. The method of claim 19, further comprising:
moving mobile ions from the molding compound layer through the doped dielectric layer.

* * * * *